(12) United States Patent
Nam et al.

(10) Patent No.: US 11,781,207 B2
(45) Date of Patent: Oct. 10, 2023

(54) GALVANIZED STEEL SHEET HAVING EXCELLENT HARDNESS AND GALLING RESISTANCE

(71) Applicant: POSCO, Pohang-si (KR)

(72) Inventors: Kyung-Hoon Nam, Gwangyang-si (KR); Yong-Hwa Jung, Gwangyang-si (KR); Kyoung-Pil Ko, Gwangyang-si (KR); Tae-Yeob Kim, Gwangyang-si (KR); Woo-Sung Jung, Gwangyang-si (KR)

(73) Assignee: POSCO CO., LTD, Pohang-si (KR)

( * ) Notice: Subject to any disclaimer, the term of this patent is extended or adjusted under 35 U.S.C. 154(b) by 141 days.

(21) Appl. No.: 17/297,258

(22) PCT Filed: Nov. 27, 2019

(86) PCT No.: PCT/KR2019/016483
§ 371 (c)(1),
(2) Date: May 26, 2021

(87) PCT Pub. No.: WO2020/111779
PCT Pub. Date: Jun. 4, 2020

(65) Prior Publication Data
US 2022/0025503 A1 Jan. 27, 2022

(30) Foreign Application Priority Data
Nov. 29, 2018 (KR) .......................... 10-2018-0151372

(51) Int. Cl.
*C23C 4/137* (2016.01)
*B32B 15/01* (2006.01)
(Continued)

(52) U.S. Cl.
CPC ............ *C23C 4/137* (2016.01); *B32B 15/013* (2013.01); *B32B 15/04* (2013.01); *B32B 15/043* (2013.01);
(Continued)

(58) Field of Classification Search
CPC .. C23C 4/137; C23C 4/02; C23C 4/06; C23C 4/08; C23C 4/12; C23C 4/18;
(Continued)

(56) References Cited

U.S. PATENT DOCUMENTS

| 5,135,817 A | 8/1992 | Shimogori et al. |
| 2003/0003321 A1 | 1/2003 | Sugimaru et al. |

(Continued)

FOREIGN PATENT DOCUMENTS

| DE | 1905908 | 9/1969 |
| DE | 2011584 A1 | 4/1971 |

(Continued)

OTHER PUBLICATIONS

Chinese Office Action—Chinese Application No. 201980078848.7 dated Oct. 28, 2022, citing JP 2018-076551, WO 2018/124629, DE 1905908, DE 2011584, JP H08-41627, and WO 2013/091889.
(Continued)

*Primary Examiner* — Michael E. La Villa
(74) *Attorney, Agent, or Firm* — CANTOR COLBURN LLP

(57) ABSTRACT

Provided is a galvanized steel sheet plated by vacuum deposition and, more specifically, to a galvanized steel sheet having excellent hardness and galling resistance, and a method for manufacturing same. The zinc coated steel sheet includes: a base steel sheet; and a zinc coated layer formed on the base steel sheet. The zinc coated layer is formed of a columnar structure, and a content of Mn included in the zinc coated layer is 0.1 to 0.4 wt %.

3 Claims, 4 Drawing Sheets

(51) Int. Cl.

| | | |
|---|---|---|
| *B32B 15/00* | (2006.01) | |
| *C23C 4/06* | (2016.01) | |
| *C22C 18/00* | (2006.01) | |
| *C23C 4/02* | (2006.01) | |
| *C23C 4/18* | (2006.01) | |
| *C23C 14/26* | (2006.01) | |
| *C23C 14/16* | (2006.01) | |
| *C23C 4/12* | (2016.01) | |
| *C23C 4/08* | (2016.01) | |
| *C23C 30/00* | (2006.01) | |
| *C23C 14/56* | (2006.01) | |
| *C23C 28/02* | (2006.01) | |
| *B32B 15/04* | (2006.01) | |
| *B32B 15/18* | (2006.01) | |
| *C23C 28/00* | (2006.01) | |

(52) U.S. Cl.
CPC .............. *B32B 15/18* (2013.01); *C22C 18/00* (2013.01); *C23C 4/02* (2013.01); *C23C 4/06* (2013.01); *C23C 4/08* (2013.01); *C23C 4/12* (2013.01); *C23C 4/18* (2013.01); *C23C 14/16* (2013.01); *C23C 14/26* (2013.01); *C23C 14/562* (2013.01); *C23C 28/025* (2013.01); *C23C 28/3225* (2013.01); *C23C 30/00* (2013.01); *C23C 30/005* (2013.01); *Y10T 428/12799* (2015.01); *Y10T 428/12972* (2015.01); *Y10T 428/12979* (2015.01); *Y10T 428/26* (2015.01); *Y10T 428/265* (2015.01)

(58) Field of Classification Search
CPC ....... C23C 14/16; C23C 14/26; C23C 14/562; C23C 30/00; C23C 30/005; C23C 28/3225; C23C 28/025; B32B 15/013; B32B 15/04; B32B 15/043; B32B 15/18; C22C 18/00; Y10T 428/26; Y10T 428/265; Y10T 428/12799; Y10T 428/12972; Y10T 428/12979
See application file for complete search history.

(56) References Cited

U.S. PATENT DOCUMENTS

| | | |
|---|---|---|
| 2015/0030875 A1 | 1/2015 | Lee et al. |
| 2015/0352812 A1 | 12/2015 | Jung et al. |
| 2017/0350029 A1* | 12/2017 | Hong .................... C23C 28/023 |
| 2018/0044774 A1 | 2/2018 | Allely et al. |
| 2019/0366687 A1 | 12/2019 | Kwak et al. |
| 2020/0002803 A1 | 1/2020 | Kwak et al. |

FOREIGN PATENT DOCUMENTS

| | | | |
|---|---|---|---|
| JP | S54159340 | 12/1979 | |
| JP | S6417852 A | 1/1989 | |
| JP | H0841627 | 2/1996 | |
| JP | H09143657 | 6/1997 | |
| JP | H10265941 | 10/1998 | |
| JP | 2018076551 | 5/2018 | |
| KR | 20020011396 | 2/2002 | |
| KR | 20130075501 | 7/2013 | |
| KR | 20140083836 | 7/2014 | |
| KR | 20180074990 | 7/2018 | |
| KR | 20180075429 A | 7/2018 | |
| WO | 2013091889 | 6/2013 | |
| WO | WO-2016105082 A1 * | 6/2016 | ........... C23C 14/025 |
| WO | 2018124629 | 7/2018 | |

OTHER PUBLICATIONS

Japanese Office Action—Japanese Application No. 2021-530076 dated Aug. 2, 2022, citing JP 2018-076551.
EP Extended Search Report dated Nov. 15, 2021 re: Application No. PCT/KR2019/016483, pp. 1-9, citing: US 5 135 817 A, KR 2018 0075429 A, JP S64 17852 A and DE 20 11 584 A1.
International Search Report—PCT/KR2019/016483 dated Aug. 7, 2020.
Chinese Office Action—Chinese Application No. 201980078848.7 dated Mar. 23, 2023, citing US 2015/0352812, U.S. Pat. No. 5,135,817, Xue et al., and Tian et al.
Tian et al., Microstructure and Performance of Ni—Al2O3 Nano-Composite Coatings Prepared by Electrophoretic-Electrodeposition, Journal of Materials Protection, vol. 48, No. 08, Aug. 2015.
Xue et al., Research Development of Manufacture Technology and Anticorrosion Mechanism of Zn—Mg Alloy Coating on Steel Sheet, Plating and Finishing, vol. 30, No. 09, Sep. 2008.

* cited by examiner (a)

(b)

(c)

GALVANIZED STEEL SHEET HAVING EXCELLENT HARDNESS AND GALLING RESISTANCE

TECHNICAL FIELD

The present disclosure relates to a galvanized steel sheet (or a zinc coated steel sheet) coated by a vacuum deposition method, and more particularly, to a zinc coated steel sheet having excellent hardness and galling resistance, and a method of manufacturing the same.

BACKGROUND ART

In many cases, galvanizing is performed for the purpose of improving corrosion resistance, durability, and the like of steel products. Galvanizing has been widely used for electroplating or hot-dip plating. Galvanized steel sheets are widely used throughout industry because the corrosion resistance thereof is significantly improved by sacrificial corrosion resistance of zinc, compared to a steel sheet that is not galvanized.

In recent years, as the demand for light and economical products having excellent corrosion resistance is increasing, a zinc coating method through vacuum deposition has been developed instead of the conventional electroplating or a hot-dip plating method. This is a method of coating zinc on a continuous strip by vacuum deposition.

Since a zinc coated layer formed by the vacuum deposition method grows into a columnar structure in a form of a column, an empty space may occur between a growing column and column, which causes a problem in that density of the coating layer decreases. Such a low-density zinc coated layer has low hardness, and has a problem of deteriorating galling resistance.

Various attempts have been made in hot-dip plating to improve the density of the zinc plated layer. For example, in Patent Document 1, an attempt was made to improve mechanical properties of the plating layer by adding a small amount of magnesium and aluminum to a zinc plating bath. In addition, in Patent Document 2, a method of securing excellent workability by using a zinc plating bath containing Ti, B, Si, or the like, in addition to a small amount of Mg and Al. However, in Patent Documents 1 and 2, magnesium cannot be added alone due to hot-dip plating characteristics, and aluminum is added together in consideration of the fluidity and stability of the molten metal. In addition, in another technique, there is a technique of refining the grains of the plated layer by using a small amount of rare earth elements, boron, and the like.

However, all of the above techniques are applied to the hot-dip galvanizing method, and have not been attempted in the case of using vacuum deposition.
(Patent Document 1) Japanese Publication No. 1979-159340
(Patent Document 2) Japanese Publication No. 1997-143657

DISCLOSURE

Technical Problem

An aspect of the present disclosure is to provide a zinc coated steel sheet capable of increasing density of zinc grains in a zinc coated layer prepared by vacuum deposition and securing excellent hardness and galling resistance, and a method of manufacturing the same.

Technical problems to be achieved in the present disclosure are not limited to the technical problems mentioned above, and other technical problems, not mentioned, will be clearly understood by those skilled in the art from the following description.

Technical Solution

According to an aspect of the present disclosure, a zinc coated steel sheet having excellent hardness and galling resistance, includes: a base steel sheet; and a zinc coated layer formed on the base steel sheet, wherein the zinc coated layer is formed of a columnar structure, and a content of Mg of the zinc coated layer is 0.1 to 0.4 wt. %.

According to another aspect of the present disclosure, a method of manufacturing a zinc coated steel sheet having excellent hardness and galling resistance includes: preparing abase steel sheet; forming a zinc coated layer through spraying vapor generated by electromagnetic levitation induction heating of a coating raw material onto the base steel sheet, wherein the coating raw material is a Zn—Mg alloy or a mixture of Zn and Mg having a content of Mn of 0.1 to 0.4 wt %.

Advantageous Effects

According to the present disclosure, a zinc coated steel sheet of the present disclosure may provide a zinc coated steel sheet having high density of zinc grains in the coated layer, and having high hardness and excellent mechanical properties.

BEST MODE FOR INVENTION

Figure 1:
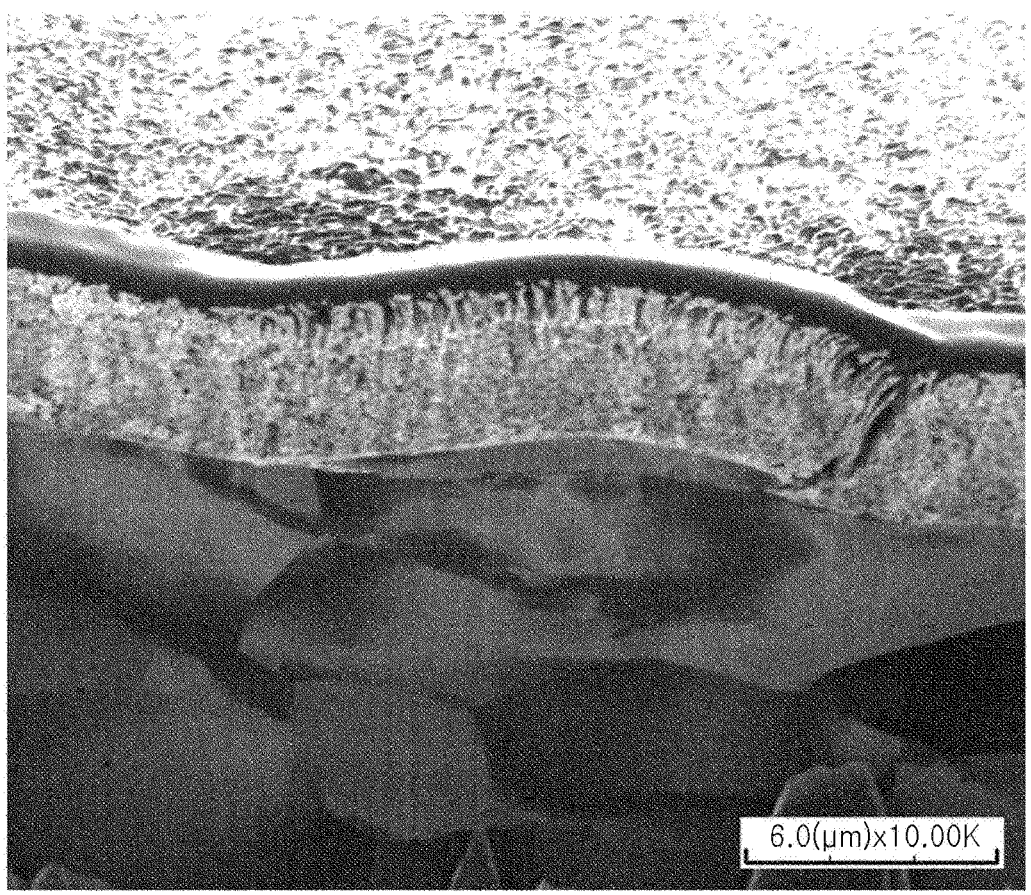
FIG. 1 is an image observing a cross-section of the coated layer of Comparative Example 1 among Experimental Examples.

Hereinafter, the present disclosure will be described in detail.

The present disclosure relates to a technique for forming a zinc coated layer using a vacuum deposition technique. The zinc coated layer formed by vacuum deposition has a characteristic in that zinc grains are formed in a columnar structure. The present disclosure was devised to solve the problem in that, in zinc coated layer formed by vacuum deposition, density of the zinc grains having a columnar structure is lowered.

In the present disclosure, the zinc coated steel sheet includes a base steel sheet and a zinc coated layer formed on the base steel sheet.

In this case, the zinc coated layer is formed by the vacuum deposition process described above, and it is preferable that the zinc grains of the zinc coated layer have a columnar structure. In general, the coated layer formed by hot-dip galvanizing has a structure, similar to that of a casting structure, and the coated layer formed by electrogalvanizing has a hexagonal plate-like structure.

In contrast, the zinc coated layer of the present invention has a columnar structure formed by vacuum deposition. The columnar structure formed by the vacuum deposition is obtained through the following process. That is, zinc vapor moves to the base steel sheet to generate nuclei in a form of a plurality of islands. Subsequently, the columnar structure grows gradually in a vertical direction by accumulating the zinc vapor on each island continuously. In this case, as each column grows and merges with the neighboring columns, a diameter (grain size) of columns increases. And, the diameter of the column varies depending on a temperature of the base steel sheet, a thickness of the coating layer, and the like.

Meanwhile, the base steel sheet is sufficient as long as it is applicable to a person skilled in the art in the technical field which the present disclosure belongs to, and the type thereof is not particularly limited. The kind or shape of a hot-rolled steel sheet, a cold-rolled steel sheet, a wire rod, or the like, is not particularly limited.

It is preferable that the zinc coated layer of the present disclosure includes 0.1 to 0.4% of magnesium (Mg) by weight. The magnesium serves to increase the density of the zinc coated layer through grain refinement.

When Mg is added to Zn, Mg is solubilized in Zn and reaches a limit of solubility at about 0.1%. Mg added from this time is distributed in a grain boundary in a fine size. As the content of Mg increases, an area of the grain boundary increases, and the size of Zn grains is reduced. Therefore, the content of Mg is preferably 0.1% or more, which is higher than the solubility.

However, when the amount of Mg exceeds a certain amount, a Zn—Mg compound is generated, and from this point, the characteristics of the Zn—Mg compound appear. In addition, when the content of magnesium (Mg) in the zinc coated layer exceeds 0.4%, while the grain size is no longer small, it is not preferable because adhesion due to high brittleness decreases, galling resistance decreases, and the coating properties are deteriorated.

Therefore, in the zinc coated layer of the present disclosure, the content of Mg is preferably 0.1 to 0.4%, and more preferably 0.2 to 0.4% in terms of galling resistance.

Meanwhile, according to an aspect of the present disclosure, the thickness of the zinc coated layer is not particularly limited as long as it can be formed by vacuum deposition in the art, but may preferably be in the range of 1 µm or more and 10 µm or less.

That is, according to an aspect of the present disclosure, it becomes possible to form a zinc coated layer with a thin thickness of 1 µm or more and 10 µm or less, which is a range that cannot be obtained when the zinc coated layer is formed by the conventional electroplating method or hot-dip plating method.

Therefore, according to the present disclosure, a steel sheet having a thin zinc coated layer may be effectively obtained relatively easily compared to the prior art, and by optimizing a content of Mg in the zinc coated layer, a zinc coated steel sheet capable of simultaneously securing excellent hardness and galling resistance may be obtained.

In addition, according to an aspect of the present disclosure, an average size of the zinc grains of the zinc coated layer is preferably 80 to 200 nm when the thickness of the coated layer is about 3 µm, and more preferably 80 to 120 nm in terms of securing galling resistance.

In addition, according to an aspect of the present disclosure, the average size of zinc grains in the zinc coated layer is preferably 60% or less, and more preferably 35% or less, compared to the average size of zinc grains when a pure zinc coated layer without Mg is added under the same conditions.

In the present disclosure, the average size of the grains refers to a diameter per circle observed when the surface of the zinc coated layer is observed vertically.

Since the average size of the grains varies depending on the coating conditions or thickness of coated layer, it is difficult to determine a certain size, and when the thickness of the coated layer is about 3 µm, it is preferably 200 nm or less. The smaller the grain size is, the better the hardness and galling resistance of the coated layer is. However, in aspect of an additional equipment or a process during coating, it is preferable that the size of grains be 80 nm or more.

According to an aspect of the present disclosure, it is preferable that Mg contained in the zinc coated layer is mainly distributed in grain boundaries of zinc grains.

That is, according to an aspect of the present disclosure, the Mg contained in the zinc coated layer may be 80% or more, more preferably 90% or more, except for 0.1% of the solid solution.

Alternatively, according to an aspect of the present disclosure, the following relational formula 1 may be satisfied. That is, most of the Mg contained in the coated layer except for 0.1 wt. % of Mg solid-solubilized with Zn in the coated layer may be present in the grain boundary.

[Content of Mg in the zinc grain boundary (wt. %)]/[Content of Mg in the coated layer (wt. %)−0.1]≥0.95    [Relational expression 1]

Alternatively, according to an aspect of the present disclosure, when an average value of the content of Mg is calculated by extracting an integer number of points corresponding to the zinc grain boundaries and points corresponding to an inside of the zinc grains in the zinc coated layer, the average value of the content of Mg present in the zinc grain boundaries may be higher than the average value of the content of Mg present inside the zinc grains.

The zinc coated steel sheet of the present disclosure has high density of the zinc coated layer, so that the zinc coated layer has high strength, and has excellent galling resistance and adhesion.

Hereinafter, an example of a method of manufacturing a zinc coated steel sheet of the present disclosure will be described in detail.

In order to manufacture the zinc coated steel sheet of the present disclosure, a method of manufacturing the zinc coated steel sheet includes: preparing a base steel sheet; and forming a zinc coated layer by vacuum depositing on a surface of the prepared base steel sheet.

As the base steel sheet, a cold-rolled steel sheet is used usually, and as described above, it is sufficient as long as it is applicable to a person skilled in the art the present disclosure belongs to, and the type is not particularly limited.

Meanwhile, it is possible to perform a pretreatment process before forming the zinc coated layer on the base steel sheet. For example, after removing foreign materials on the surface thereof such as rolling oil, or the like, through alkaline degreasing, or the like, it is sequentially moved to a vacuum chamber. Vacuum deposition coating may perform on the base steel sheet sequentially moved in the vacuum chamber after removing a fine oxide layer of a surface layer by using plasma.

A zinc coated layer is formed on a surface of the prepared base steel sheet by vacuum deposition. The vacuum deposition method may be an electron beam method, a sputtering method, a thermal evaporation method, an induction heating evaporation method, an ion coating method, or the like. But, preferably the zinc coated layer may be formed by an electromagnetic flotation induction heating coating method having an electromagnetic stirring effect.

According to an aspect of the present disclosure, in order to manufacture a zinc coated layer having high density containing Mg, it is preferable to use a coating raw material having the same composition as the target composition. That is, as the coating raw material, a Zn—Mg alloy having a content of Mg of 0.2 to 0.4 wt % or a mixture of Zn metal and Mg metal having a content of Mg of 0.2 to 0.4 wt %, by adjusting a mixing ratio of Zn metal and Mg metal, may be used. Alternatively, in terms of galling resistance, more preferably, as a coating material, a Zn—Mg alloy having a content of Mg of 0.2 to 0.4 wt % or a mixture of Zn metal and Mg metal having a content of Mg of 0.2 to 0.4 wt %, by adjusting a mixing ratio of the Zn metal and the Mg metal, may be used.

Among the vacuum deposition methods, an electron beam method, a thermal evaporation method, an ion coating method, and the like, may not be uniform in a composition of the coating over time, and the composition of the coating raw material and the composition of the coating layer may vary, so it is somewhat difficult to apply to a coating requiring precise composition control as in the present disclosure.

In contrast, in the electromagnetic flotation induction heating coating using the electromagnetic stirring effect, a coating layer having a constant composition may be formed by continuously injecting raw materials into a molten metal and stirring the molten metal electromagnetically.

More specifically, Zn and Mg individual metals are added to the molten metal in a desired content ratio, or a Zn—Mg alloy raw material is added, and then Zn—Mg vapor generated by electromagnetic stirring of the molten metal is deposited to the base steel sheet through a spray nozzle, such that the coated layer is formed.

MODE FOR INVENTION

Hereinafter, the present disclosure will be described in more detail through examples. However, it is necessary to note that the following examples are only intended to illustrate the present disclosure in more detail and are not intended to limit the scope of the present disclosure. This is because the scope of the present disclosure is determined by matters described in the claims and able to be reasonably inferred therefrom.

(Experimental Example)

A cold-rolled steel sheet having a thickness of 0.1 mm was prepared, and pure Zn having a content of Mg of 0 wt. % to be used as a coating material in Comparative Example 1 was prepared. And, a Zn—Mg alloy having a content of Mg of 0.1 to 0.6 wt. % to be used as a coating material in Inventive Examples 1 to 4 and Comparative Examples 2 and 3 was prepared.

About 2 kg of such a coating material was charged into a crucible and then heated by electromagnetic induction to induce vapor generated by melting, and sprayed on a surface of the base steel sheet to form a zinc coated layer having a columnar structure. In this case, a degree of vacuum inside the vacuum chamber was maintained at $1\times10^{-2}$ mbar or less, and all facilities for generating, moving, and dispersing vapor were heated and maintained at 700° C. or higher, so that the vapor was not condensed inside the facility and sprayed onto the steel sheet. The coating raw material was continuously added to molten metal inside the crucible, and the thickness of the coated layer was formed to be about 3 μm. The content of Mg of the prepared zinc coated layer is shown in Table 1 below.

For the zinc coated steel sheet prepared as described above, hardness, galling resistance, and adhesion were measured, and the results were shown in Table 1 below.

The hardness was measured using a micro Vickers tester, using a load of 5 gf and a loading time of 10 seconds.

For adhesion, after attaching a tape with excellent adhesion to the coated layer, the coated steel sheet was bent by 180°, and the presence and level of the coated layer removed from the tape were evaluated, and the evaluation results were represented as excellent (◉), good (○), and poor (X) as follows.

◉: after bending a coated steel sheet by 180°, there is no coated layer removed by tape ○: after bending a coated steel sheet by 180°, only fine coating traces exist on the tape X: after bending a coated steel sheet by 180°, there is a coated layer removed by the tape Meanwhile, the galling resistance was confirmed by measuring the number of frictional rotations until a coefficient of friction exceeds 0.3 while rotating a steel ball formed of chromium-plated for cold-processing mold steel on a specimen at a load of 5 MPa and a rate of 200 mm/s.

TABLE 1

| Classification | Mg content (wt. %) | Micro hardness (Hv) | Number of galling frictions | Adhesion | Size of Zn grains (nm) |
| --- | --- | --- | --- | --- | --- |
| CE 1 | 0 | 70 | 24 | ◉ | 350 |
| IE 1 | 0.1 | 80 | 32 | ◉ | 200 |
| IE 2 | 0.2 | 95 | 84 | ◉ | 120 |
| IE 3 | 0.3 | 105 | 65 | ○ | 100 |
| IE 4 | 0.4 | 110 | 55 | ○ | 80 |
| CE 2 | 0.5 | 115 | 24 | X | 80 |
| CE 3 | 0.6 | 115 | 18 | X | 100 |

Figure 2:
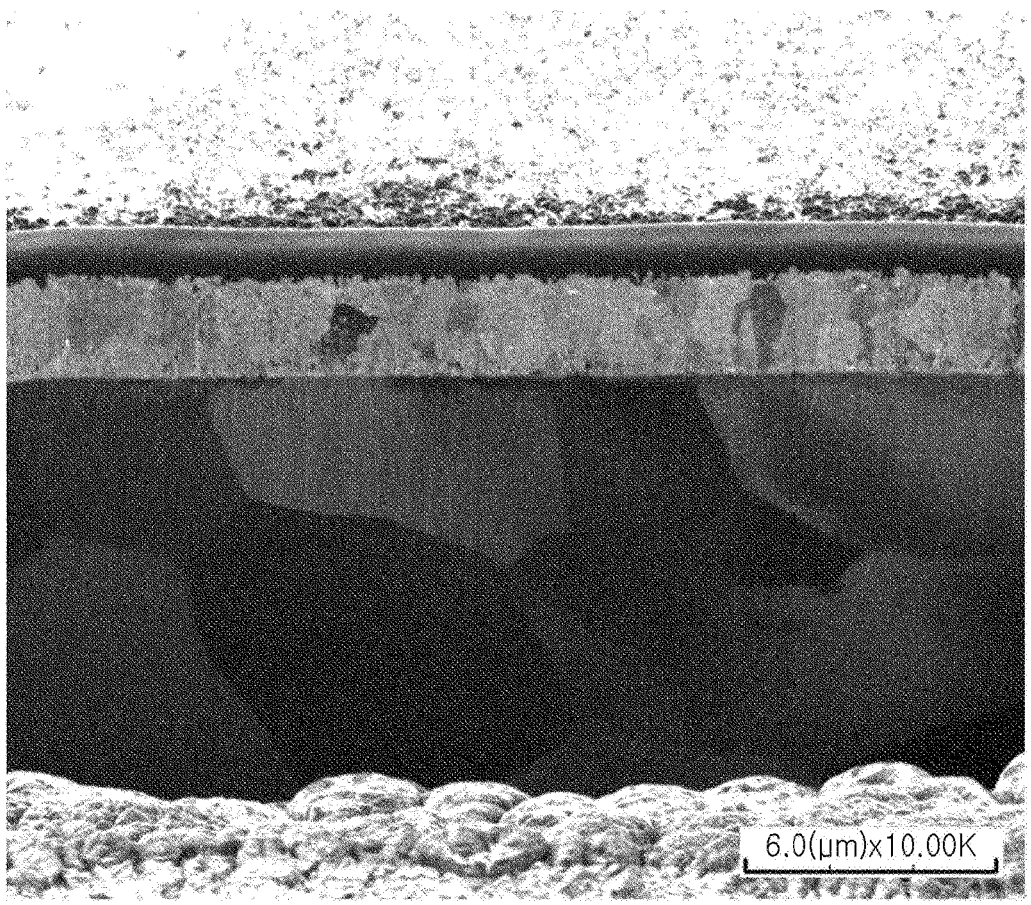
FIG. 2 is an image observing a cross-section of the coated layer of Inventive Example 2 among Experimental Examples.

FIG. 1 is a photograph illustrating a cross-section of the zinc coated layer of Comparative Example 1, and FIG. 2 is a photograph illustrating a cross-section of the coated layer of Inventive Example 2. As shown in the results of FIGS. 1 and 2, in Comparative Example 1, the grain of the zinc coated layer formed a columnar structure, and the density of zinc grains was low due to presence of an empty space between columns and other columns. On the other hand, in Inventive Example 2, high density of zinc grains may be confirmed.

Figure 3:
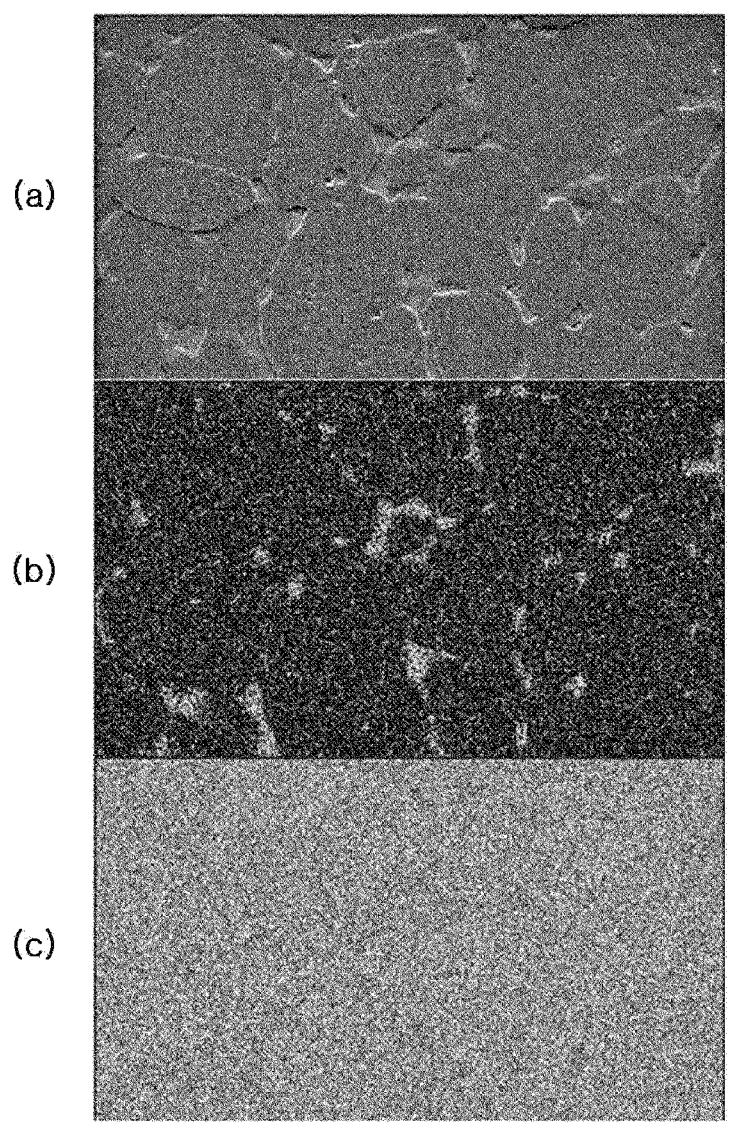
FIG. 3 represents a photograph of zinc grains, and a distribution of components of the Inventive Example 2.

Meanwhile, (a) to (c) in FIG. 3 are photographs illustrating a microstructure of the zinc coated layer and a distribution of each component of Inventive Example 2, respectively, and as can be seen from the results of FIG. 3, it can be seen that in the zinc coated layer, Zn is distributed throughout the coated layer, but Mg is mainly distributed at an grain boundary of the zinc grain.

In addition, in Inventive Example 2, about 10 points corresponding to a zinc grain boundary and about 10 points corresponding to an inside of the zinc grain in the zinc coated layer, were extracted, and then the content of Mg was analyzed.

For each extracted point, when an average value was calculated by measuring the content of Mg present in the zinc grain boundary and the content of Mg present in the zinc grain, it can be confirmed that the content of Mg present in the zinc grain boundary is high compared to the content of Mg present inside of the zinc grain.

Figure 4:
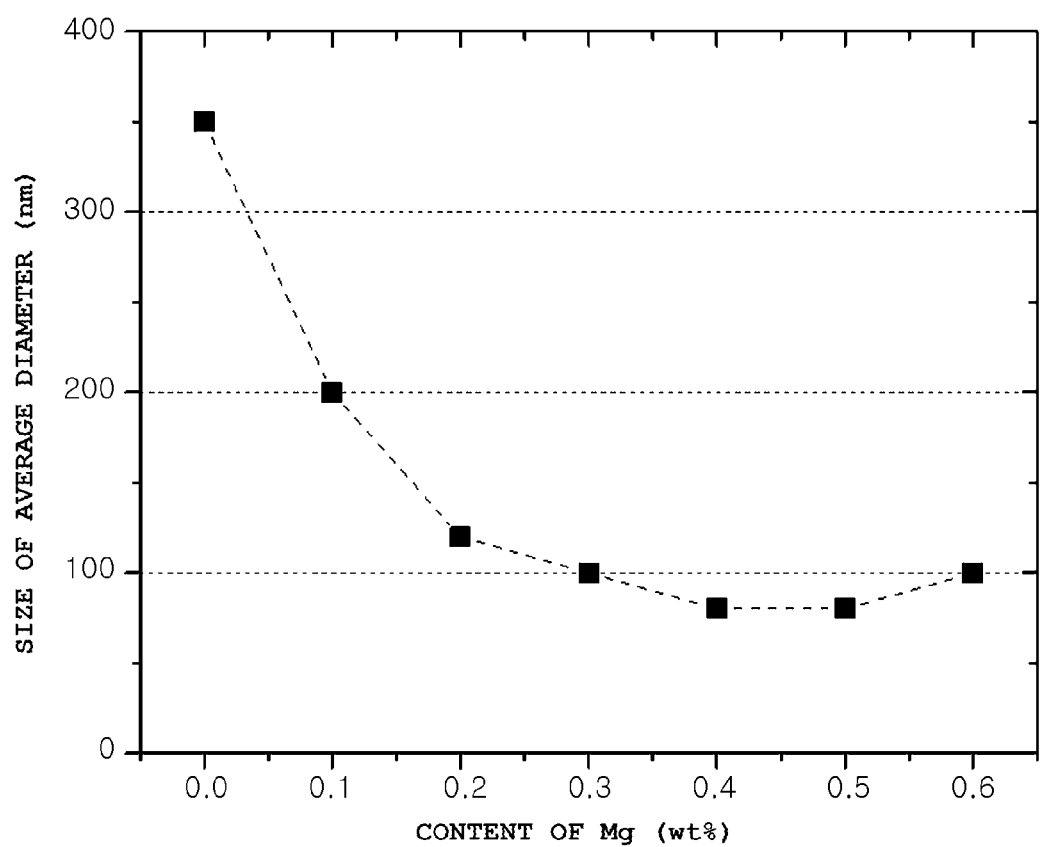
FIG. 4 is a graph illustrating an average size of zinc grains in the coated layer of an embodiment.

FIG. 4 is a graph showing the results of observing a particle size of zinc grains in the zinc coated layers of Comparative Examples 1 to 3 and Inventive Examples 1 to 4 of Table 1 above.

In summarizing the above results, it can be seen that, in the Inventive Examples satisfying the conditions presented in the present disclosure, the zinc coated layer has excellent hardness and at the same time, has excellent galling resistance and adhesion.

However, it can be seen that, as in Comparative Example 1, when Mg is not included or an amount of Mg is too small, the density of the coated layer is too low, so that it can be seen that hardness and galling resistance are deteriorated.

On the other hand, when the content of Mg is too high, there is no effect of increasing the hardness, and it can be seen that the galling resistance and adhesion are deteriorated.

While example embodiments have been shown and described above, it will be apparent to those skilled in the art that modifications and variations could be made without departing from the scope of the present inventive concept as defined by the appended claims.

The invention claimed is:

1. A zinc coated steel sheet having excellent hardness and galling resistance, comprising:
 a base steel sheet; and
 a zinc coated layer formed on the base steel sheet,
 wherein the zinc coated layer is formed of a columnar structure, and a content of Mg included in the zinc coated layer is 0.1 to 0.4 wt %, and
 wherein the zinc coated layer has zinc grains having an average size of 80 to 200 nm.

2. The zinc coated steel sheet having excellent hardness and galling resistance of claim 1, wherein the zinc coated layer satisfies the following relational formula 1,

[Content of Mg in the zinc grain boundary (wt. %)]/[Content of Mg in the coated layer (wt. %)−0.1]≥0.95.     [Relational expression 1]

3. A zinc coated steel sheet having excellent hardness and galling resistance, comprising:
 a base steel sheet; and
 a zinc coated layer formed on the base steel sheet,
 wherein the zinc coated layer is formed of a columnar structure, and a content of Mg included in the zinc coated layer is 0.1 to 0.4 wt %, and
 wherein the zinc coated layer satisfies the following relational formula 1

[Content of Mg in the zinc grain boundary (wt. %)]/[Content of Mg in the coated layer (wt. %)−0.1]≥0.95.     [Relational expression 1]

\* \* \* \* \*